(12) United States Patent
Chi et al.

(10) Patent No.: US 8,289,671 B2
(45) Date of Patent: Oct. 16, 2012

(54) CASE STRUCTURE

(75) Inventors: Chia-Ming Chi, Taipei (TW);
Kuo-Cheng Chu, Taipei (TW)

(73) Assignee: Compal Electronics, Inc., Taipei (TW)

( * ) Notice: Subject to any disclaimer, the term of this patent is extended or adjusted under 35 U.S.C. 154(b) by 272 days.

(21) Appl. No.: 12/820,155

(22) Filed: Jun. 22, 2010

(65) Prior Publication Data
US 2010/0321853 A1    Dec. 23, 2010

Related U.S. Application Data

(60) Provisional application No. 61/219,405, filed on Jun. 23, 2009.

(51) Int. Cl.
*H01H 47/00* (2006.01)
(52) U.S. Cl. .................................. 361/212; 361/220
(58) Field of Classification Search .............. 361/212, 361/220

See application file for complete search history.

(56) References Cited

U.S. PATENT DOCUMENTS

| 4,958,255 A | 9/1990 | Pritchard |
| 5,309,841 A * | 5/1994 | Hartman et al. ........... 102/202.4 |
| 2006/0266544 A1 | 11/2006 | Tung et al. |
| 2007/0121308 A1 | 5/2007 | Chiang |
| 2008/0239610 A1 * | 10/2008 | Yu et al. ...................... 361/120 |

FOREIGN PATENT DOCUMENTS

TW    201006315    2/2010

OTHER PUBLICATIONS

"Office Action of Taiwan counterpart application" issued on Aug. 9, 2012, p. 1-7, in which the listed reference was cited.

* cited by examiner

*Primary Examiner* — Danny Nguyen
(74) *Attorney, Agent, or Firm* — Jianq Chyun IP Office

(57) ABSTRACT

A case structure for an electronic device includes a first conductive layer, a conductive housing, and a surface treatment layer. The first conductive layer has a taper protrusion. The conductive housing is disposed at one side of the first conductive layer, and a narrow end of the taper protrusion faces the conductive housing. The surface treatment layer is disposed between the taper protrusion and the second conductive layer.

9 Claims, 2 Drawing Sheets

CASE STRUCTURE

CROSS-REFERENCE TO RELATED APPLICATION

This application claims the priority benefit of U.S. provisional application Ser. No. 61/219,405, filed on Jun. 23, 2009. The entirety of the above-mentioned patent application is hereby incorporated by reference herein and made a part of specification.

BACKGROUND OF THE INVENTION

1. Field of the Invention

The present invention relates to a case structure, and more particular to a case structure capable of preventing electrostatic discharge and blocking a leakage current.

2. Description of Related Art

Electrostatic discharge prevention has become an import subject of product safety in current electronic devices. To avoid damage of electrical components in the electronic device originated from the electrostatic discharge, one typical technique is to install a diode between two different grounds within the electronic device, as disclosed in U.S. Pat. No. 4,958,255.

In addition, when a user operates the electronic device, the electrostatic charge carried by the human body may also enter the electronic device through a seam of a housing of the electronic device to discharge. To address this issue, a conductor or a circuit board capable of electrostatic discharge prevention is disposed between the housing and electrical components. The conductor or circuit board is connected to a ground such that the electrostatic charges are conducted to the ground instead of hitting the electrical components in the housing. These techniques are disclosed by US20070121308 and US20060266544.

These techniques can only avoid the damage of internal electrical components caused by discharge of electrostatic charges entering the electronic device from outside the housing. However, these techniques fail to consider the fact that the motherboard module in the housing may generate a leakage current during use of the electronic device. This leakage current may be conducted to the housing of the electronic device to cause an electric shock. In addition, these techniques require additional components in the housing, which reduces the usable space within the housing as well as increases the cost of the electronic device.

SUMMARY OF THE INVENTION

Accordingly, the present invention is directed to a case structure with improved reliability and safety.

One embodiment of the present invention provides a case structure for an electronic device. The case structure includes a first conductive layer, a second conductive layer, and a first surface treatment layer. The first conductive layer includes a taper protrusion. The second conductive layer is disposed at one side of the first conductive layer. A narrow end of the taper protrusion faces the second conductive layer. The first surface treatment layer is disposed between the taper protrusion and the second conductive layer. When the second conductive layer receives static electricity, the static electricity is attracted by the narrow end of the taper protrusion and jumps to the first conductive layer. When the electronic device generates a leakage current transferring to the first conductive layer, the leakage current is blocked by the first surface treatment layer and does not reach the surface of the second conductive layer.

In view of the foregoing, in the above embodiment of the present invention, the taper protrusion is formed on the first conductive layer, with the narrow end of the taper protrusion facing the second conductive layer. In addition, the first surface treatment layer is formed between the taper protrusion and the second conductive layer. Therefore, the electrostatic charges outside the electronic device can be conducted to the first conductive layer through the point discharge effect of the taper protrusion, thus avoiding the damage to the components in the electronic device. Moreover, the case structure further blocks the leakage current generated by the internal components of the electronic device with its surface treatment layer, thus preventing the leakage current from being conducted to the case to cause an electric shock.

Other objectives, features and advantages of the present invention will be further understood from the further technological features disclosed by the embodiments of the present invention wherein there are shown and described preferred embodiments of this invention, simply by way of illustration of modes best suited to carry out the invention.

DESCRIPTION OF THE EMBODIMENTS

Figure 1:
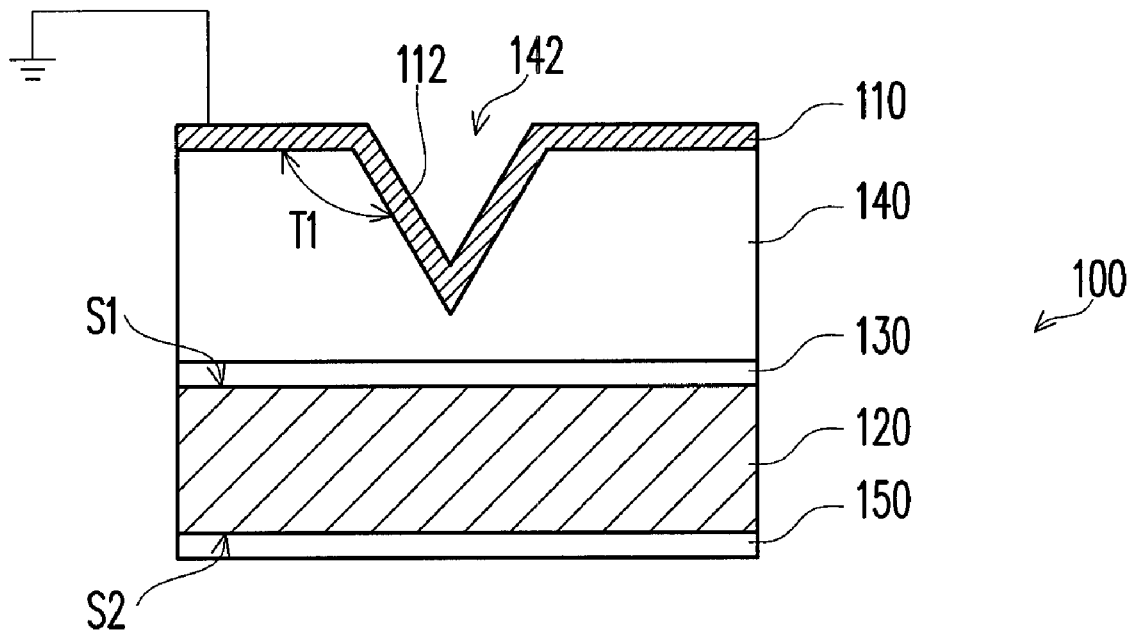
FIG. 1 illustrates a case structure according to one embodiment of the present invention.

FIG. 1 illustrates a case structure according to one embodiment of the present invention. Referring to FIG. 1, the case structure 100 is suitable for an electronic device (not shown). In the present embodiment, the case structure 100 includes a first conductive layer 110, a second conductive layer 120, a first surface treatment layer 130, and an insulating layer 140. According the requirement of the product, the first conductive layer 110 may be a metal layer, the second conductive layer 120 may be a metal layer, the first surface treatment layer 130 may be a metal oxide layer, and the insulating layer 140 may be a plastic layer. The first conductive layer 110 is disposed on the insulating layer 140. The insulating layer 140 has a recess 142 such that a portion of the first conductive layer 110 within the recess 142 forms a taper protrusion 112.

In addition, the second conductive layer 120 is disposed at one side of the first conductive layer 110. The first surface treatment layer 130 is disposed between the insulating layer 140 and the second conductive layer 120, and a narrow end of the taper protrusion 112 faces the second conductive layer 120. In other words, the first surface treatment layer 130 is disposed between the taper protrusion 112 and the second conductive layer 120. The first surface treatment layer 130 may be a structure formed by performing a surface treatment on the second conductive layer 120. When the second conductive layer 120 is a metal layer, the first surface treatment layer 130 is a metal oxide layer.

The case structure 100 has the first conductive layer 110, first surface treatment layer 130 and the second conductive layer 120 arranged sequentially. The taper protrusion 112 is formed on the first conductive layer 110 and the narrow end of the taper protrusion 112 faces the second conductive layer 120. Therefore, electrostatic charges on the second conductive layer 120 can be jumped to the first conductive layer 110 through the point discharge effect caused by the attraction of the charges of the taper protrusion 112 and further eliminated by connecting the first conductive layer 110 to ground to protect components within the electronic device. Besides, the case structure 100 may further block a leakage current generated by the components in the electronic device with the first surface treatment layer 130, thus preventing the leakage current from being conducted to the second conductive layer 120 to cause an electric shock. Since energy of electrostatic charges is greater than energy of leakage current, the electrostatic charges can be transferred from the second conductive layer 120 to the first conductive layer 110 by passing through the first surface treatment layer 130 via the taper protrusion 112 in the first conductive layer 110, but the leakage current will be blocked by the first surface treatment layer 130 and cannot be transferred from the first conductive layer 110 to the second conductive layer 120 by passing through the first surface treatment layer 130 via the taper protrusion 112 in the first conductive layer 110.

In the present embodiment, the second conductive layer 120 has a first surface S1 and a second surface S2, and the first surface treatment layer 130 is disposed on the first surface S1. In one embodiment, the first surface treatment layer 130 may be formed by performing a surface treatment on the second conductive layer 120 and has a thickness less than 7 micrometers. Once the first conductor housing 120 is formed on the insulating layer 140 and the first conductive layer 110 on the recess 142 of the insulating layer 140, the second conductive layer 120 is disposed at one side of the insulating layer 140 in a floating manner. As such, the first surface treatment layer 130 between the taper protrusion 112 and the first conducting housing 120 acts to block the transfer of leakage current. On the other hand, because the thickness of the first surface treatment layer 130 is relatively small, high voltage electrostatic charges can still pass through the first surface treatment layer 130 and be transferred to the first conductive layer 110 without being affected by the first surface treatment layer 130.

In addition, the case structure 100 further includes a second surface treatment layer 150 disposed on the second surface S2 of the second conductive layer 120. The second surface treatment layer 150 is also formed by performing a surface treatment on the second conductive layer 120. In this embodiment, the first surface treatment layer 130 and the second surface treatment layer 150 on opposite surfaces of the second conductive layer 120 can act to protect the second conductive layer 120 from surface corrosion.

It is noted that, to ensure successful transfer of electrostatic charges between the second conductive layer 120 and the taper protrusion 112 of the first conductive layer 110, an angle T1 formed between a side surface of the taper protrusion 112 and a planar portion of the first conductive layer 110 where the taper protrusion 112 is not located is preferably within the range from 10 degrees to 179 degrees. This enables the narrow end of the taper protrusion 112 to maintain its orientation toward the second conductive layer 120, thereby ensuring the point discharge between the first conductive layer 110 and the second conductive layer 120. Besides, in order to form the taper protrusion 112 that facilitates the point discharge, the recess 142 of the insulating layer 140 is preferably cone-shaped or pyramid-shaped. In the present embodiment, the shape of the taper protrusion 112 may be a regular pyramid or a right cone. However, in another embodiment not shown, the shape of the taper protrusion may be an oblique pyramid or an oblique cone. That is to say that the axis of the taper protrusion is oblique to a plane in which the first surface treatment layer 130 is located.

Figure 2:
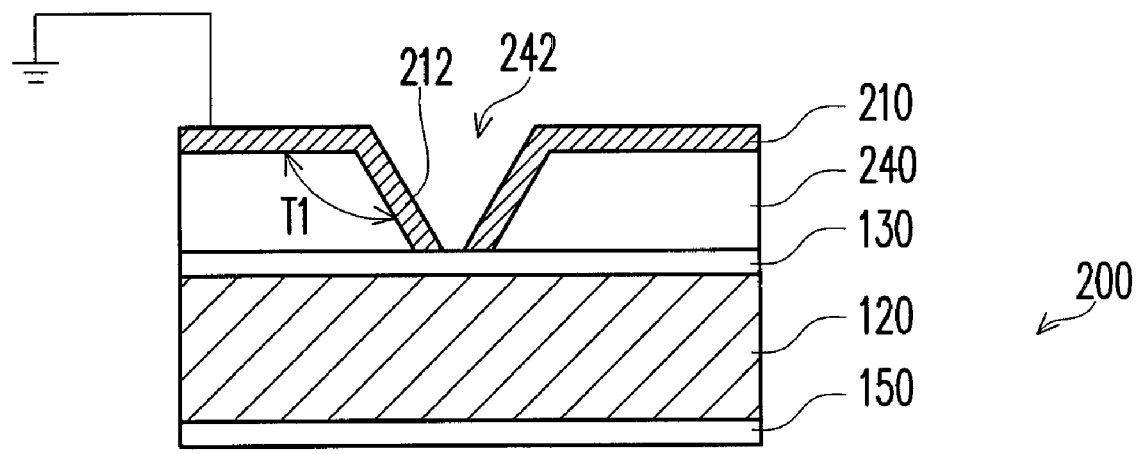
FIG. 2 illustrates a case structure according to another embodiment of the present invention.

FIG. 2 illustrates a case structure according to another embodiment of the present invention. Referring to FIG. 2, different from the above embodiment, in the case structure 200, the recess 242 extends through the insulating layer 240 so as to be truncated cone-shaped. In this case, the first conductive layer 210 at the taper protrusion 212 directly contacts the first surface treatment layer 130 on the second conductive layer 120, which can achieve the same result as the above embodiment.

Figure 3:
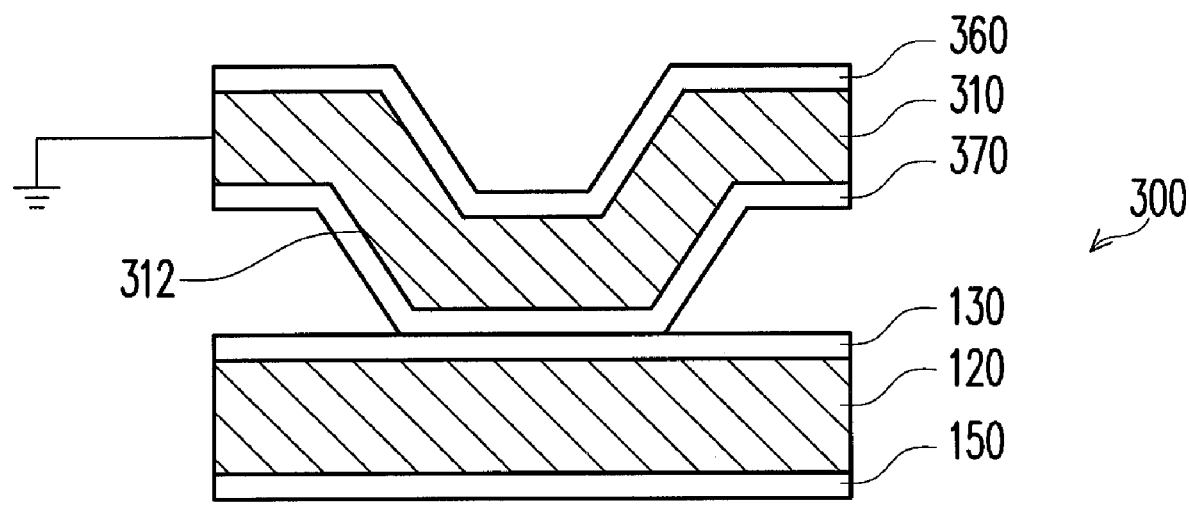
FIG. 3 illustrates a case structure according to still another embodiment of the present invention.

FIG. 3 illustrates a case structure according to still another embodiment of the present invention. Referring to FIG. 3, different from the above embodiment, in the case structure 300 of the present embodiment, the first conductive layer 110 of the above-described case structure 100a is formed by a conductive housing 310. In other words, instead of the insulating layer 140 and the second conductive layer 120 constituting a main body of the case structure 100 in the above embodiments, the main body of the case structure 300 consists of the second conductive layer 120 and the conductive housing 310.

In the present embodiment, the conductive housing 310 includes a taper protrusion 312 which is formed by, for example, stamping the conductive housing 310. Like the taper protrusion 112 formed using the recess 142 of the insulating layer 140, the taper protrusion 312 also has the point discharge function. In addition, the conductive housing 310 is connected to ground. Therefore, the case structure 300 can also prevent electrostatic discharge and leakage current when constructed in a similar manner as described in the above embodiments.

In addition, the case structure 300 further includes a third surface treatment layer 360 and a fourth surface treatment layer 370 disposed on opposite surfaces of the conductive housing 310, respectively. Similar to the first surface treatment layer 130 and the second surface treatment layer 150, the third surface treatment layer 360 and the fourth surface treatment layer 370 are also formed by performing a surface treatment on the conductive housing 310 and used to protect the conductive housing 310 from surface corrosion.

In summary, in the above embodiments of the present invention, the case structure has the first conductive layer, the surface treatment layer and the conductive housing arranged sequentially. The taper protrusion is formed on the first conductive layer, with the narrow end of the taper protrusion facing the conductive housing. Therefore, the case structure can block the leakage current with its surface treatment layer and, at the same time, transfer the electrostatic charges on the second conductive layer to the first conductive layer through the point discharge of the taper protrusion. This enables the case structure to prevent electrostatic discharge and leakage current without extra components, thus effectively increasing the reliability and safety of the electronic device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A case structure for an electronic device, the case structure comprising:

a first conductive layer including a taper protrusion;

a second conductive layer disposed at one side of the first conductive layer, a narrow end of the taper protrusion facing the second conductive layer;

a first surface treatment layer disposed between the taper protrusion and the second conductive layer;

when the second conductive layer receives static electricity, the static electricity is attracted by the narrow end of the taper protrusion and jumps to the first conductive layer; and when the electronic device generates a leakage current transferring to the first conductive layer, the leakage current is blocked by the first surface treatment layer and does not reach the surface of the second conductive layer.

2. The case structure according to claim 1, wherein an angle formed between a side surface of the taper protrusion and a planar surface of the first conductive layer where the taper protrusion is not located is within the range from 10 degrees to 179 degrees.

3. The case structure according to claim 1, wherein the first surface treatment layer is disposed on a first surface of the second conductive layer.

4. The case structure according to claim 3, further comprising:

a second surface treatment layer disposed on a second surface of the second conductive layer that is opposite to the first surface.

5. The case structure according to claim 1, further comprising:

an insulating layer disposed between the first conductive layer and the first surface treatment layer, the first conductive layer disposed on the insulating layer, the insulating layer having a recess, the portion of the first conductive layer that is within the recess forming the taper protrusion.

6. The case structure according to claim 5, wherein the recess is cone-shaped or pyramid-shaped.

7. The case structure according to claim 5, wherein the recess extends through the insulating layer.

8. The case structure according to claim 1, wherein the first conductive layer is formed by a conductive housing.

9. The case structure according to claim 8, further comprising a third surface treatment layer and a fourth surface treatment layer disposed on opposite surfaces of the conductive housing, respectively.

* * * * *